US009088282B2

(12) United States Patent
Holenarsipur et al.

(10) Patent No.: US 9,088,282 B2
(45) Date of Patent: Jul. 21, 2015

(54) PROXIMITY SENSORS WITH OPTICAL AND ELECTRICAL SENSING CAPABILITIES

(71) Applicant: Apple Inc., Cupertino, CA (US)

(72) Inventors: Prashanth S. S. Holenarsipur, Fremont, CA (US); Anant Rai, San Jose, CA (US); David Lukofsky, San Jose, CA (US)

(73) Assignee: Apple Inc., Cupertino, CA (US)

( * ) Notice: Subject to any disclaimer, the term of this patent is extended or adjusted under 35 U.S.C. 154(b) by 106 days.

(21) Appl. No.: 13/750,961

(22) Filed: Jan. 25, 2013

(65) Prior Publication Data

US 2014/0213323 A1   Jul. 31, 2014

(51) Int. Cl.
*H04M 1/00* (2006.01)
*H03K 17/955* (2006.01)
*G06F 3/044* (2006.01)
*H03K 17/94* (2006.01)
*G06F 1/16* (2006.01)
*G06F 3/041* (2006.01)
*H04W 52/02* (2009.01)
*H03K 17/96* (2006.01)

(52) U.S. Cl.
CPC .............. *H03K 17/955* (2013.01); *G06F 1/169* (2013.01); *G06F 1/1684* (2013.01); *G06F 3/044* (2013.01); *G06F 3/0416* (2013.01); *H03K 17/941* (2013.01); *G06F 2203/04106* (2013.01); *H03K 2017/9602* (2013.01); *H03K 2217/94108* (2013.01); *H04M 2250/12* (2013.01); *H04W 52/0254* (2013.01)

(58) Field of Classification Search
CPC ................ H04M 2250/12; H04W 52/020254; H03K 17/941; H03K 17/955; H03K 2217/94108; G06F 2203/04106; G01S 17/026

USPC .................. 455/566, 550.1, 522, 13.4, 556.1
See application file for complete search history.

(56) References Cited

U.S. PATENT DOCUMENTS

| 4,804,945 A | 2/1989 | Millet |
| 6,664,744 B2 | 12/2003 | Dietz |
| 8,432,322 B2 | 4/2013 | Amm et al. |
| 2005/0180711 A1 | 8/2005 | Kamath et al. |
| 2011/0120784 A1 | 5/2011 | Osoinach et al. |

(Continued)

OTHER PUBLICATIONS

William Matthew Vieta, U.S Appl. No. 13/599,664, filed Aug. 30, 2012.

(Continued)

*Primary Examiner* — Barry Taylor
(74) *Attorney, Agent, or Firm* — Treyz Law Group; Jason Tsai; Joseph F. Guihan

(57) ABSTRACT

An electronic device may be provided with a touch screen display that is controlled based on information from a proximity sensor. The proximity sensor may have a light source that emits infrared light and a light detector that detects reflected infrared light. When the electronic device is in the vicinity of a user's head, the proximity sensor may produce data indicative of the presence of the user's head. Variations in proximity sensor output due to user hair color and smudges on the proximity sensor can be accommodated by using an electrical sensing mechanism in addition to the light sensing mechanism. The proximity sensor may include a pair of capacitive electrodes for generating an electric field in the vicinity of the device. The presence of a user's head can sufficiently disturb the electric field so as to produce data indicative of the presence of the user's head.

16 Claims, 10 Drawing Sheets

(56) References Cited

U.S. PATENT DOCUMENTS

| | | | |
|---|---|---|---|
| 2012/0109455 A1 | 5/2012 | Newman et al. | |
| 2012/0250949 A1* | 10/2012 | Abiko | 382/115 |
| 2012/0320385 A1* | 12/2012 | Mu et al. | 356/624 |
| 2013/0075579 A1* | 3/2013 | Chen | 250/205 |
| 2013/0100076 A1* | 4/2013 | Tu et al. | 345/175 |
| 2013/0176264 A1* | 7/2013 | Alameh et al. | 345/174 |
| 2013/0201102 A1* | 8/2013 | Klinghult | 345/156 |
| 2013/0314365 A1* | 11/2013 | Woolley et al. | 345/174 |

OTHER PUBLICATIONS

US 8,427,376, 04/2013, Schlub et al. (withdrawn)

\* cited by examiner

| SCENARIO | OPTICAL SENSING | ELECTRICAL SENSING | USER NEARBY? |
| --- | --- | --- | --- |
| A | 0 | 0 | NO |
| B | 0 | 1 | YES |
| C | 1 | 0 | NO |
| D | 1 | 1 | YES |

FIG. 9

PROXIMITY SENSORS WITH OPTICAL AND ELECTRICAL SENSING CAPABILITIES

BACKGROUND

This relates generally to electronic devices and, more particularly, to electronic devices with proximity sensors.

Cellular telephones are sometimes provided with proximity sensors. For example, a cellular telephone may be provided with a proximity sensor that is located near an ear speaker on a front face of the cellular telephone.

The front face of the cellular telephone may also contain a touch screen display. The proximity sensor may be used to determine when the cellular telephone is near the head of a user. When not in proximity to the head of the user, the cellular telephone may be placed in a normal mode of operation in which the touch screen display is used to present visual information to the user and in which the touch sensor portion of the touch screen is enabled. In response to determining that the cellular telephone has been brought into the vicinity of the user's head, the display may be disabled to conserve power and the touch sensor on the display may be temporarily disabled to avoid inadvertent touch input from contact between the user's head and the touch sensor.

A proximity sensor for use in a cellular telephone may be based on an infrared light-emitting diode and a corresponding infrared light detector. During operation, the light-emitting diode may emit infrared light outwards from the front face of the cellular telephone. When the cellular telephone is not in the vicinity of a user's head, the infrared light will not be reflected towards the light detector and only small amounts of reflected light will be detected by the light, detector. When, however, the cellular telephone is adjacent to the user's head, the emitted light from the infrared light-emitting diode will be reflected from the user's head and detected by the light detector.

Light-based proximity sensors such as these may be used to detect the position of a cellular telephone relative to a user's head, but can be challenging to operate accurately. If care is not taken, it can be difficult to determine when a user's head is in the vicinity of the cellular telephone, particularly when a user has hair that is dark and exhibits low reflectivity or when the proximity sensor has become smudged with grease from the skin of the user.

It would therefore be desirable to be able to provide improved ways in which to use proximity sensors to accurately determine whether a user's head is in the vicinity of cellular telephone or other electronic device.

SUMMARY

An electronic device may be provided with electronic components such as a touch screen display. The touch screen display may be controlled based on information from a proximity sensor. For example, when the proximity sensor indicates that the electronic device is not near the head of a user, the electronic device may be operated in a normal mode in which the display is used to display images and in which the touch sensor functionality of the display is enabled. When the proximity sensor indicates that the electronic device is in the vicinity of the user's head, the electronic device may be operated in a close proximity mode in which display pixels in the display are disabled and in which the touch sensor functionality of the display is disabled.

The proximity sensor may include optical proximity sensor circuitry that is used to gather optical proximity sensor data and electrical proximity sensor circuitry circuit that is used to gather capacitive proximity sensor-data. The optical proximity sensor data may include an emitter element that includes a light-emitting diode capable of emitting infrared light and a detector element that includes a photodiode capable of detecting corresponding reflected infrared light. The electrical proximity sensor circuitry may include at least first and second capacitive electrodes. The first and second capacitive electrodes may be coplanar conductive structures and/or ring-shaped conductive structures that laterally surround the optical proximity sensor circuitry.

The proximity sensor may output an integrated, sensor output signal that includes the optical proximity sensor data and the capacitive proximity sensor data to an associated digital signal processing circuitry. The signal processing circuitry can be used to extract the optical proximity sensor data from the integrated sensor output signal by demodulating the integrated sensor output signal using a periodic control signal during a first detection mode and can also be used to extract the capacitive proximity sensor data from the integrated sensor output signal by demodulating the integrated sensor output signal using a phase-shifted version of the periodic control signal during a second detection mode.

Sensor data extracted in this way may be processed to determine whether an external object is in the vicinity of the electronic device. As an example, the extracted optical signal component (i.e., the extracted optical proximity sensor data) may be compared to a predetermined light threshold, whereas the extracted electrical signal component (i.e., the extracted capacitive proximity sensor-data) may be compared to a baseline capacitance to determine whether an external object is in close proximity to the proximity sensor. As another example, a proximity sensor score can be computed by weighting the optical proximity sensor data and the capacitive proximity sensor data with different respective weighting factors. The computed proximity sensor score may then be compared to a predetermined threshold score to determine whether an external object is in the vicinity of the electronic device.

Further features of the present invention, its nature and various advantages will be more apparent from the accompanying drawings and the following detailed description.

BRIEF DESCRIPTION OF THE DRAWINGS

FIG. 9 is a table of different scenarios that can be identified, using a proximity sensor having optical and electrical sensing capabilities in accordance with an embodiment of the present invention.

DETAILED DESCRIPTION

An electronic device may be provided with electronic components such as touch screen displays. The functionality of the electronic device may be controlled based on how far the electronic device is located from external objects such as a user's head. When the electronic device is not in the vicinity of the user's head, for example, the electronic device can be operated in a normal mode in which the touch screen display is enabled. In response to detection of the presence if the user's head in the vicinity of the electronic device, the electronic device may be operated in a mode in which the touch screen is disabled or other appropriate actions are taken. Disabling touch sensing capabilities from the electronic device when the electronic device is near the user's head may help avoid inadvertent touch input as the touch sensor comes into contact, with the user's ear and hair. Disabling display functions in the touch screen display when the electronic device is near the user's head may also help conserve power and reduce user confusion about the status of the display.

An electronic device may use one or more proximity sensors to detect external objects. As an example, an electronic device may use an infrared-light-based proximity sensor to gather proximity data. During operation, proximity data from the proximity sensor may foe compared to one or more threshold values. Based on this proximity sensor data analysis, the electronic device can determine whether or not the electronic device is near the user's head and can take appropriate action. A proximity sensor may detect the presence of external objects via optical sensing mechanisms, electrical sensing mechanism, and/or other types of sensing techniques.

Figure 1:
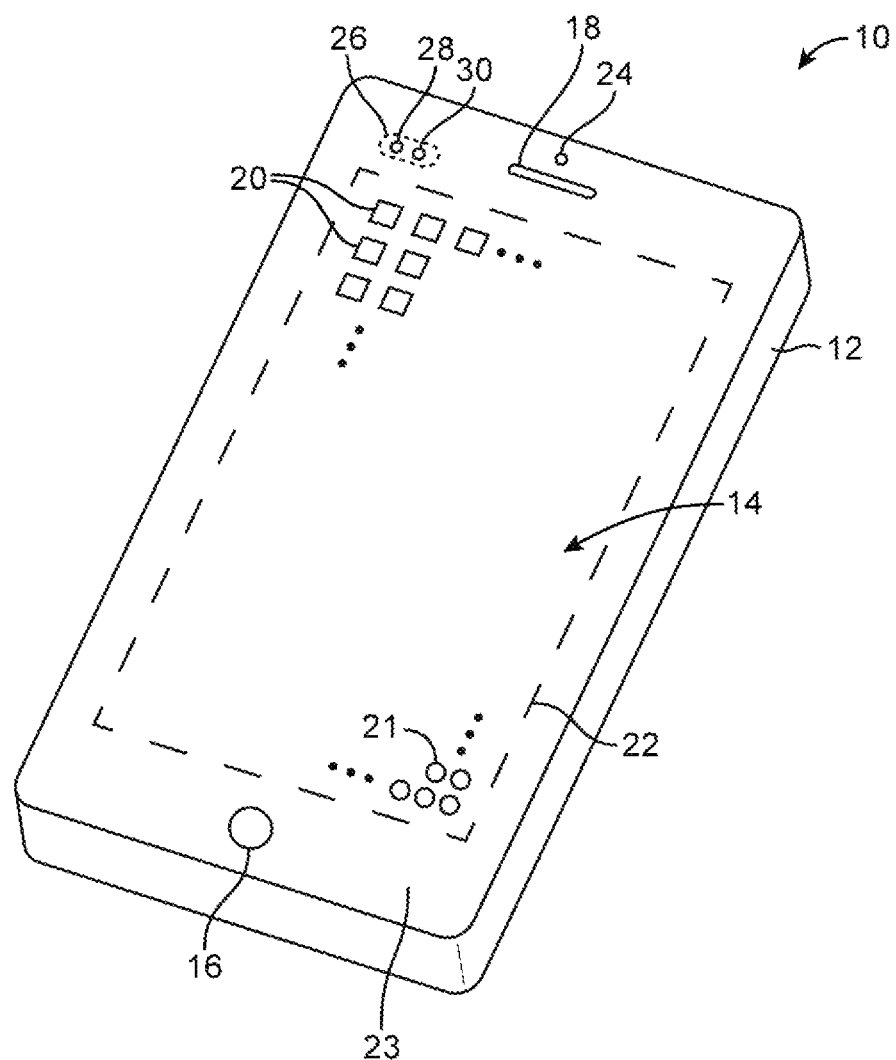
FIG. 1 is a perspective view of an illustrative electronic device with a proximity sensor in accordance with embodiments of the present invention.

An illustrative electronic device that may be provided with a proximity sensor is shown in FIG. 1. Electronic devices such as device 10 of FIG. 1 may be cellular telephones, media players, other handheld portable devices, somewhat smaller portable devices such as wrist-watch devices, pendant devices, or other wearable or miniature devices, gaming equipment, tablet computers, notebook computers, desktop computers, televisions, computer monitors, computers integrated into computer displays, or other electronic equipment.

As shown in the example of FIG. 1, device 10 may include a display such as display 14. Display 14 may be mounted in a housing such as housing 12. Housing 12 may have upper and lower portions joined by a hinge (e.g., in a laptop computer) or may form a structure without a hinge, as shown in FIG. 1. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch, sensor electrodes such as electrodes 20 or other touch sensor components (e.g., resistive touch sensor components, acoustic touch sensor components, force-based touch sensor components, light-based touch sensor components, etc.) or may be a display that is not touch-sensitive. Capacitive touch screen electrodes 20 may be formed from an array of indium tin oxide pads or other transparent conductive structures.

Display 14 may include an array of display pixels such as pixels 21 formed from liquid crystal display (LCD) components, an array of electrophoretic display pixels, an array of plasma display pixels, an array of organic light-emitting diode display pixels, an array of electrowetting display pixels, or display pixels based on other display technologies. The brightness of display 14 may be adjustable. For example, display 14 may include a backlight unit formed from a light source such as a lamp or light-emitting diodes that can be used to increase or decrease display backlight levels (e.g., to increase or decrease the brightness of the image produced by display pixels 21) and thereby adjust display brightness. Display 14 may also include organic light-emitting diode pixels, or other pixels, with adjustable intensities. In this type of display, display brightness can be adjusted by adjusting the intensities of drive signals used to control individual display pixels.

Display 14 may be protected using a display cover layer such as a layer of transparent glass or clear plastic. Openings may be formed in the display cover layer. For example, an opening may be formed in the display cover layer to accommodate a button such as button 16. An opening may also foe formed in the display cover layer to accommodate ports such as speaker port 18.

In the center of display 14 (e.g., in the portion of display 14 within rectangular region 22 of FIG. 1), display 14 may contain an array of active display pixels such as pixels 21. Region 22 may therefore sometimes be referred to as the active region of display 14. The rectangular ring-shaped region 23 that surrounds the periphery of active display region 22 may not contain any active display pixels and may therefore sometimes be referred to as the inactive region of display 14. The display cover layer or other display layers in display 14 may foe provided with an opaque masking layer in the inactive region to hide internal components from view by a user. Openings may be formed in the opaque masking layer to accommodate light-based components. For example, an opening may be provided in the opaque masking layer to accommodate an ambient light sensor such as ambient light sensor 24.

If desired, an opening in the opaque masking layer may be filled with an ink or other material that is transparent to infrared light but opaque to visible light. As an example, light-based proximity sensor 26 may be mounted under this type of opening in the opaque masking layer of the inactive portion of display 14. Light-based proximity sensor 26 may include a light transmitter such as light source 28 and a light sensor such as light detector 30. Light source 28 may be an infrared light-emitting diode and light detector 30 may be a photodetector based on a transistor or photodiode (as examples). During operation, proximity sensor detector 3Q may gather light from source 28 that has reflected from nearby objects. Other types of proximity sensor may be used in device 10 if desired. The use of a proximity sensor that includes infrared light transmitters and sensors is merely illustrative.

Proximity sensor 26 may detect when a user's head, a user's fingers, or other external object is in the vicinity of device 10 (e.g., within 5 cm or less of sensor 26, within 1 cm or less of sensor 26, or within other suitable distance of sensor 26).

During operation of device 10, proximity sensor data from proximity sensor 26 may be used in controlling the operation of device 10. For example, when proximity sensor measurements from sensor 26 indicate that device 10 is in the vicinity of the user's head (and that the user's head is in the vicinity of device 10), device 10 can be placed in a close proximity mode. When operating in the close proximity mode, the functionality of device 10 can be altered to ensure proper operation of device 10. For example, touch screen input can be temporarily disabled so that touch events related to contact between the user's head and one or more of capacitive touch sensor electrodes 20 can be ignored. Display brightness can also be turned down partly or fully by disabling a backlight in device 10 or by otherwise temporarily disabling display pixels 21, thereby conserving power. In the event that proximity sensor data indicates that device 10 and the user's head are not adjacent to each other, (e.g., when it is determined that device 10 is more than 1 cm from the user's head, is more than 5 cm from the user's head, etc.), device 10 can be placed in a normal (non-close-proximity) operating mode.

Figure 2:
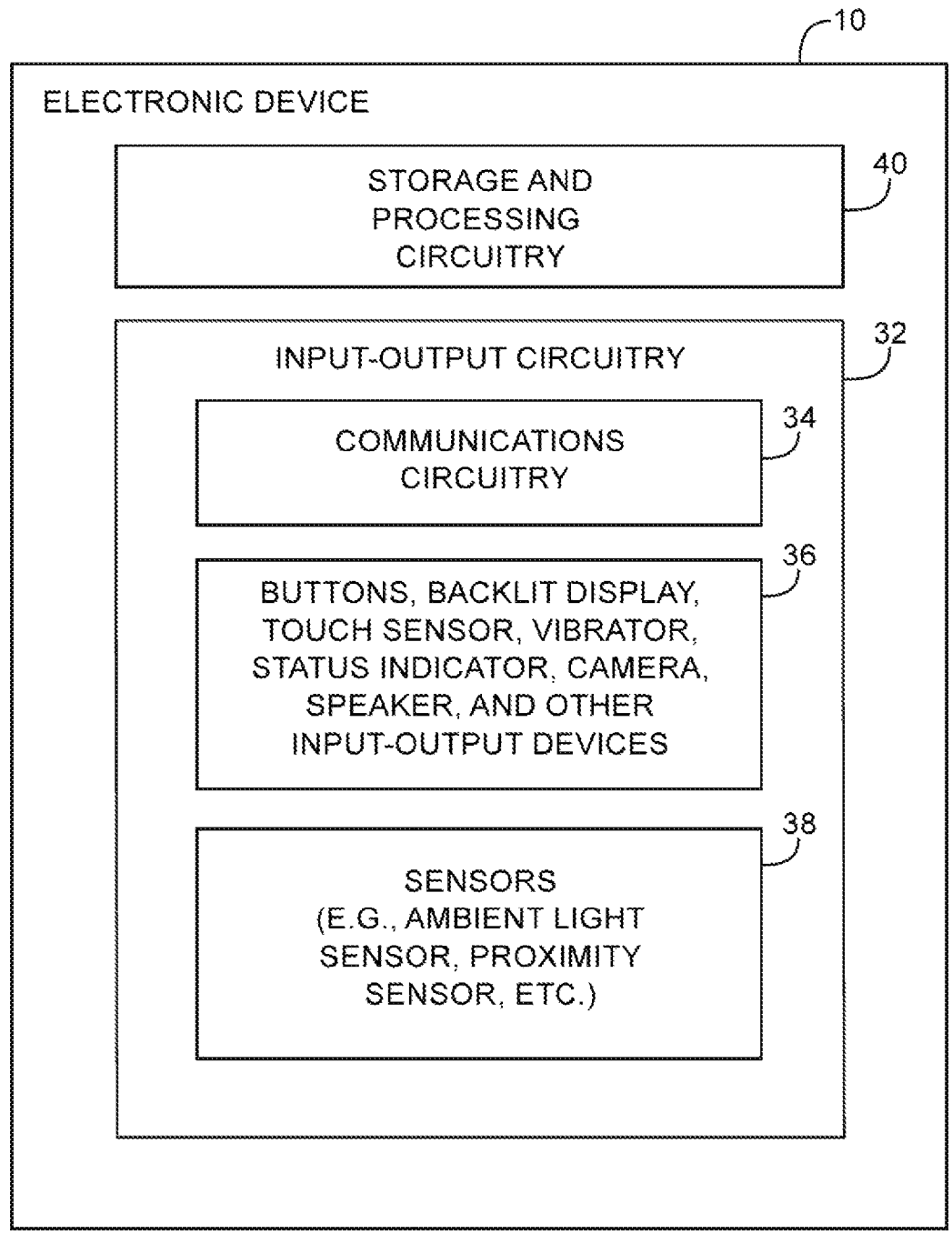
FIG. 2 is a schematic diagram of an illustrative electronic device with a proximity sensor in accordance with an embodiment of the present invention.

A schematic diagram of device 10 showing how device 10 may include sensors and other components is shown in FIG. 2. As shown in FIG. 2, electronic device 10 may include control circuitry such as storage and processing circuitry 40. Storage and processing circuitry 40 may include one or more different types of storage such as hard disk drive storage, nonvolatile memory (e.g., flash memory or other electrically-programmable-read-only memory), volatile memory (e.g., static or dynamic random-access-memory), etc. Processing circuitry in storage and processing circuitry 40 may be used in controlling the operation of device 10. The processing circuitry may be based on a processor such as a microprocessor and other suitable integrated circuits. With one suitable arrangement, storage and processing circuitry 40 may be used to run software on device 10, such as internet browsing applications, email applications, media playback applications, operating system functions, software for capturing and processing images, software implementing functions associated with gathering and processing sensor data, software that makes adjustments to display brightness and touch sensor functionality, etc.

Input-output circuitry 32 may be used to allow data to be supplied to device 10 and to allow data to be provided from device 10 to external devices.

Input-output circuitry 32 may include wired and wireless communications circuitry 34. Communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Input-output circuitry 32 may include input-output devices 36 such as button 16 of FIG. 1, joysticks, click wheels, scrolling wheels, a touch screen such as display 14 of FIG. 1, other touch sensors such as track pads or touch-sensor-based buttons, vibrators, audio components such as microphones and speakers, image capture devices such as a camera module having an image sensor and a corresponding lens system, keyboards, status-indicator lights, tone generators, key pads, and other equipment for gathering input from a user or other external source and/or generating output for a user.

Sensor circuitry such as sensors 38 of FIG. 2 may include an ambient light sensor for gathering information on ambient light levels such as ambient light sensor 2A. Ambient light sensor 24 may include one or more semiconductor detectors (e.g., silicon-based detectors) or other light detection circuitry. Sensors 38 may also include proximity sensor components. Sensors 38 may, for example, include a dedicated proximity sensor such as proximity sensor 26 and/or a proximity sensor formed from touch sensors 20 (e.g., a portion of the capacitive touch sensor electrodes in a touch sensor array for display 14 that are otherwise used in gathering touch input for device 10 such as the sensor electrodes in region 22 of FIG. 1). Proximity sensor components in device 10 may, in general, include capacitive proximity sensor components, infrared-light-based proximity sensor components, proximity sensor components based on acoustic signaling schemes, or other proximity sensor equipment. Sensors 38 may also include a pressure sensor, a temperature sensor, an accelerometer, a gyroscope, and other circuitry for making measurements of the environment surrounding device 10.

Sensor data such as proximity sensor data from sensors 38 may be used in controlling the operation of device 10. Device 10 can activate or inactivate display 14, may activate or inactivate touch screen functionality, may activate or inactivate a voice recognition function on device 10, or may take other suitable actions based at least partly on proximity sensor data.

Figure 3:
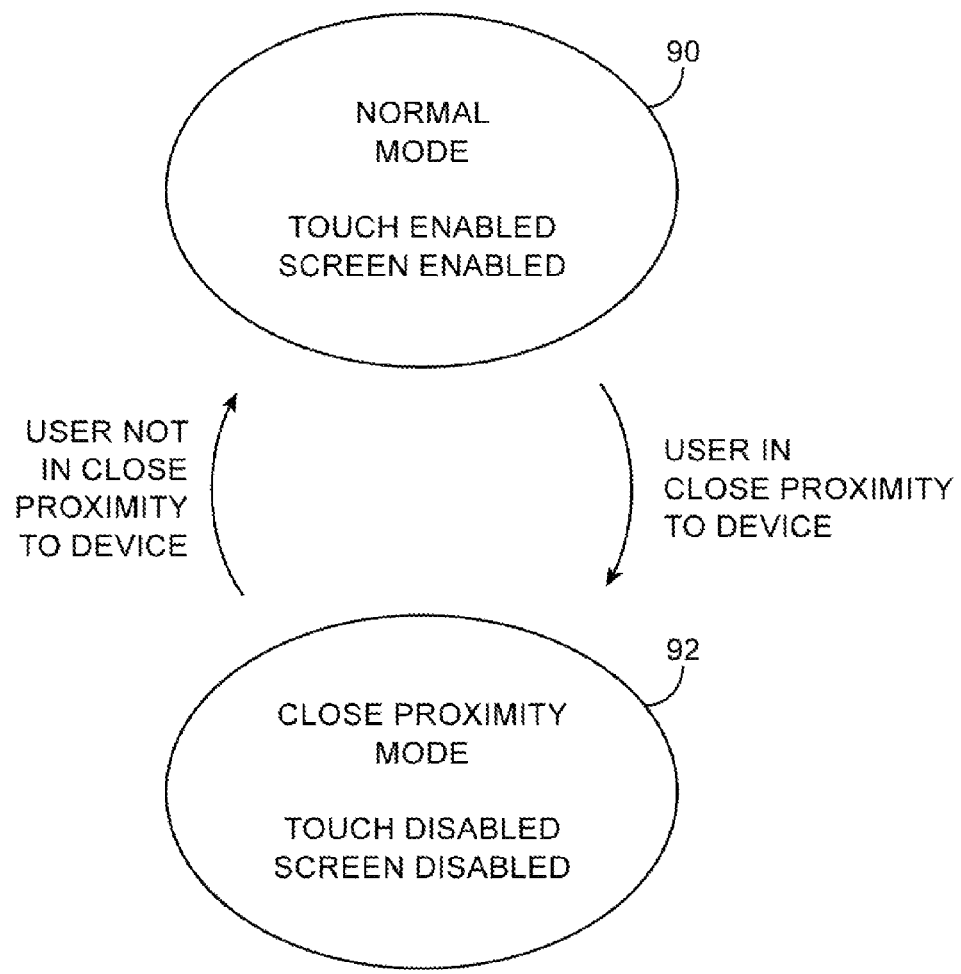
FIG. 3 is a graph showing how an electronic device may adjust display and touch sensor functionality in response to proximity sensor measurements in accordance with an embodiment of the present invention.

FIG. 3 is a diagram illustrating how the operation of device 10 may be controlled using proximity sensor data from proximity sensor 26. In state 90, device 10 may be operated in a normal mode. For example, device 10 may be operated in a mode in which storage and processing circuitry 40 enables touch sensor operation (e.g., the operation of touch sensor electrodes 20 for touch screen display 14) and enables display 14 (e.g., by adjusting display pixels 21 so that an image is displayed for a user). During the normal mode operations of step 76, device 10 may use control circuitry 40 to gather and analyze proximity sensor data from proximity sensor 26.

When the proximity sensor data is indicative of a user in close proximity to device 10, device 10 may be operated in a close proximity mode (state 92). In state 92, device 10 can take actions that are appropriate for scenarios in which device 10 is held adjacent to the head of the user. For example, control circuitry 40 may temporarily disable touch screen functionality in display 14 and/or may disable display 14 (e.g., by turning off display pixel array 21). While operating in state 92, device 10 may use control circuitry 40 to gather and analyze proximity sensor data from proximity sensor 26 to determine whether the user is no longer in close proximity to device 10. When the proximity sensor data is indicative of the absence of a user in close proximity to device 10, device 10 may be placed back, into state 90.

The example of FIG. 3 is merely illustrative. Device 10 may, in general, take any suitable action based on proximity sensor data. For example, device 10 may activate or inactivate voice recognition capabilities for device 10, may invoke one or more software programs, may activate or inactivate operating system functions, or may otherwise control the operation of device 10 in response to proximity sensor information.

Figure 4:
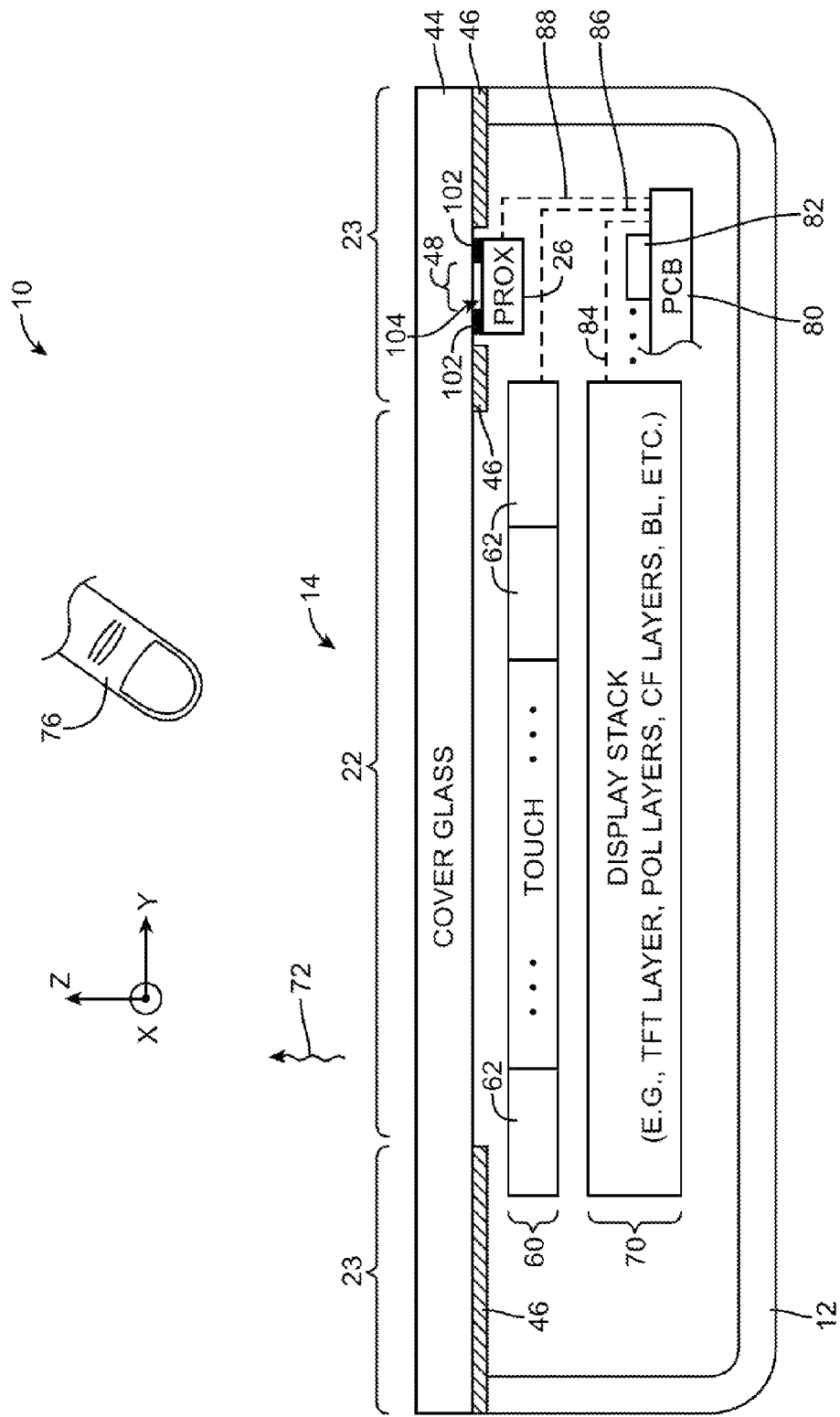
FIG. 4 is cross-sectional side view of an illustrative electronic device having a display layer and a proximity sensor in accordance with an embodiment of the present invention.

FIG. 4 is a cross-sectional side view of device 10. As shown in FIG. 4, device 10 may include a display such as display 14. Display 14 may have a cover layer such as cover layer 44. Cover layer 44 may be formed from a layer of glass, a layer of plastic, or other transparent material. If desired, the functions of cover layer 44 may be performed by other display layers (e.g., polarizer layers, anti-scratch films, color filter layers, etc.). The arrangement of FIG. 3 is merely illustrative.

Display structures that are used in forming images for display 14 may be mounted under active region 22 of display 14. Display 14 may include a display stack structure 70 having a backlight unit, light polarizing layers, color filter layers, thin-film transistor (TFT) layers, and other display structures. Display 14 may be implemented using liquid crystal display structures. If desired, display 14 may be implemented using other display technologies. The use of a liquid crystal display is merely illustrative.

The display structures of display 14 may include a touch sensor array such as touch sensor array 60 for providing display 14 with the ability to sense input from an external object such as external object 76 when external object 76 is in the vicinity of a touch sensor on array 60. With one suitable arrangement, touch sensor array 60 may be implemented on a clear dielectric substrate such as a layer of glass or plastic and may include an array of indium tin oxide electrodes or other clear electrodes such as electrodes 62. The electrodes may be used in making capacitive touch sensor measurements.

An opaque masking layer such as opaque masking layer 46 may be provided in inactive region 26. The opaque masking layer may be used to block internal device components from view by a user through peripheral edge portions of clear display cover layer (sometimes referred to as cover glass) 44. The opaque masking layer may be formed from black ink, black plastic, plastic or ink of other colors, metal, or other opaque substances. Windows such as proximity sensor window 48 may be formed in opaque masking layer 46. For example, circular holes or openings with other shapes may be formed in layer 46 to serve as proximity sensor window 48.

At least one proximity sensor 26 may be provided in device 10. As shown in FIG. 4, proximity sensor 26 may be mounted within device 10 by attaching proximity sensor 26 directly to the inner surface of cover glass 44 at proximity sensor window 43 via pressure sensitive adhesive 102 or other adhesive materials. Space 104 between proximity sensor 26 and cover glass 44 may be filled with air, glass, plastic, or other transparent material so that light may pass through window 48 during optical proximity sensing operations. If desired, proximity sensor 26 may be mounted to opaque masking layer 46, on other layers of display 14, printed circuit boards, housing structures, or other suitable mounting structures within housing 12 of device 10.

Display, touch, and sensor circuitry in device 10 may be coupled to circuitry on a substrate such as printed circuit board (PCB) 80. The circuitry on substrate 80 may include integrated circuits and other components (e.g., storage and processing circuitry 30 of FIG. 2). For example, circuitry in display stack 70 may be coupled to circuitry on substrate 80 via path 84, circuitry in touch sensor array 60 may be coupled to circuitry on substrate 80 via path 86, and proximity sensor 26 may be coupled to circuitry on substrate 80 via path 88. Paths 84, 86, and 88 may be formed using flexible printed circuit ("flex circuit") cables, indium tin oxide traces or other conductive patterned traces formed on a dielectric substrate, and/or other conductive signal path structures. These signal path structures (e.g., paths 84, 86, and 88) may have terminals that are coupled to the various circuitries within device 10 via one or more contacts such as gold pads or pads formed from other metals, metal traces using anisotropic conductive film (ACF) or other conductive adhesive, solder connections, welds, connections formed using connectors, and other types of electrical interconnect techniques.

During operation of device 10, optical sensor signals may pass through proximity sensor window 48 for use in detecting the proximity of a user body part. Signals from proximity sensor 26 may be routed to analog-to-digital converter circuitry that is implemented within the silicon substrates from which proximity sensor 26 is formed, to analog-to-digital converter circuitry that is formed in an integrated circuit that is mounted to display stack 70, or to analog-to-digital converter circuitry and/or other control circuitry located elsewhere in device 10 such as one or more integrated circuits in storage and processing circuitry 30 of FIG. 2 (e.g., integrated circuits containing analog-to-digital converter circuitry for digitizing analog proximity sensor signals from sensor 26 such as integrated circuits 32 on substrate 30).

If desired, a proximity sensor may be implemented as part of a silicon device that has additional circuitry (i.e., proximity sensor 26 may be implemented as integrated circuits). A proximity sensor with this type of configuration may be provided with built-in analog-to-digital converter circuitry and communications circuitry so that digital sensor signals can be routed to a processor using a serial interface or other digital communications path.

Conventional proximity sensors only utilize infrared light emission and infrared light detection to sense the proximity of a user's hair, ear, or other body part. The hair of users varies in reflectivity in the infrared light spectrum. Dark (e.g., black) hair tends to absorb infrared light, rather than reflecting infrared light. Dark hair may, for example, reflect less infrared light than skin. As a result, relatively low magnitude infrared-light reflections may be measured when a dark-haired (e.g., black-haired) user places device 10 next to the user's head to make a telephone call. Smudges from finger grease or other contaminants also have the potential to affect proximity sensor readings. When a smudge is present over proximity sensor 26, more infrared light will be reflected into light detector 30 than expected.

During operation, care must be taken to avoid false negatives (e.g., situations in which the absorption of light by dark hair makes it erroneously appear as though device 10 is not in the vicinity of the user's head when it is) and false positives (e.g., situations in which the reflection of fight from a smudge makes it erroneously appear as though device 10 is in the vicinity of the user's head when it is not). In accordance with an embodiment of the present invention, a proximity sensor may be provided with optical proximity sensor circuitry and electrical proximity sensor circuitry to improve proximity sensor performance in challenging operating scenarios such as these.

Figure 5:
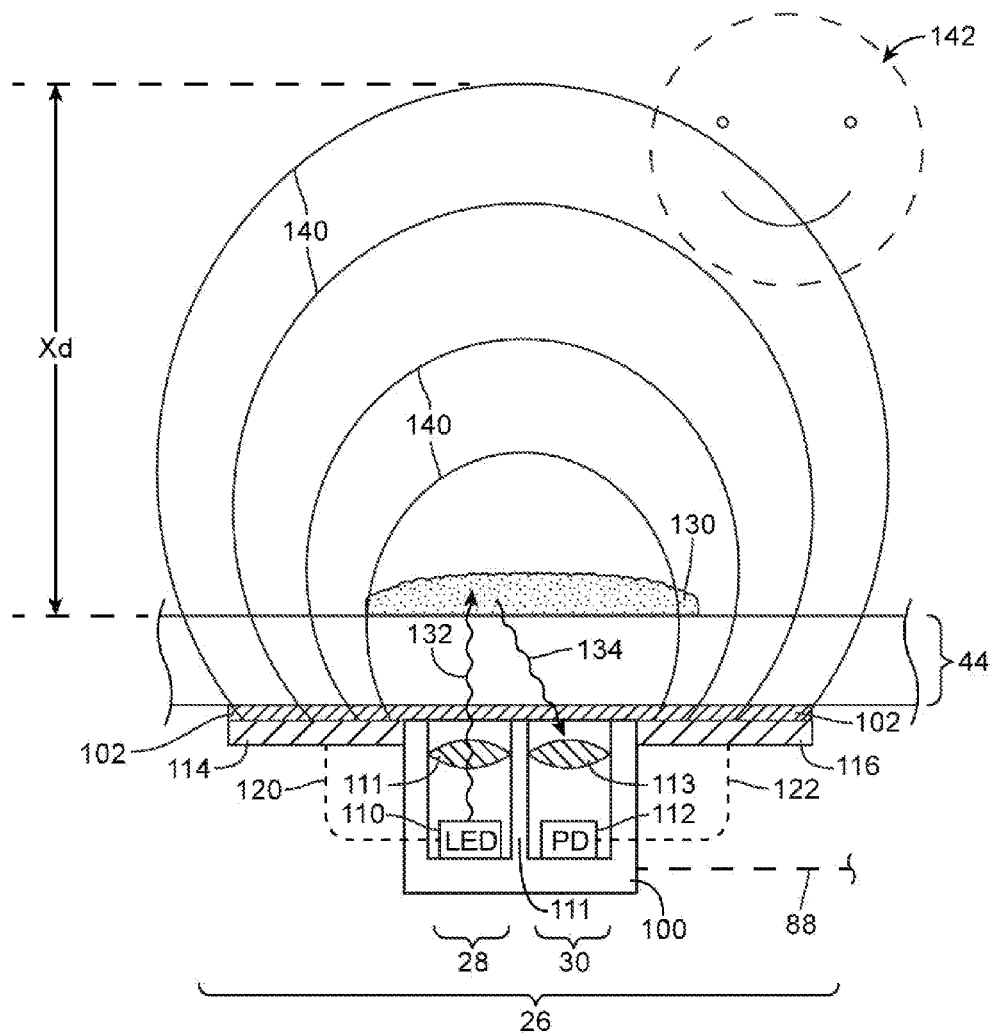
FIG. 5 is a cross-sectional side view of an illustrative proximity sensor having optical and electrical proximity sensor circuitries in accordance with an embodiment of the present invention.

FIG. 5 is a cross-sectional side view of an illustrative proximity sensor that takes into account results gathered using both optical proximity sensing techniques and electrical proximity sensing techniques. As shown in FIG. 5, proximity sensor 26 may include an emitter element 28 and a detector element 30 that are used to perform optical proximity sensing operations. Emitter element 28 may, for example, include an infrared (IR) light-emitting diode (LED) 110 and associated lens 111, whereas detector element 30 may include a corresponding photodiode (PD) 112 and associated lens 113 operable to receive infrared light. Emitter 28 and detector 30 may, for example, be formed on the same integrated, circuit or on separate integrated, circuits within one integrated circuit package 100. Package 100 may include optical isolation material 111 interposed between emitter 28 and detector 30 so as to prevent light emit from LED 110 from directly being received by photodiode 112. Material 111 may be formed from metal, infrared light filter structures, or other suitable materials that are opaque to IR light.

During operation, light-emitting diode 110 may emit infrared light outwards from the front face of device 10. When device 10 is not in the vicinity of a user's head, the infrared light will not be reflected towards sensor 112 and only small amounts of reflected light will be detected by sensor 112. When, however, device 10 is adjacent to the user's head, the light emit from infrared LED 110 will be reflected from the user's head and detected by sensor 112.

In the exemplary scenario as illustrated in FIG. 5, smudge 130 (e.g., smudge from finger grease, facial oil, or other contaminants) may be temporarily deposited on cover glass 44 above proximity sensor 26. When a smudge is present over proximity sensor 26, more infrared, light will be reflected into light detector 30 than expected (e.g., a portion of light 132 emit, from LED 110 may be inadvertently reflected back towards photodiode 112 in the presence of smudge 130, as indicated by path 134) and may potentially result in a false positive reading.

In an effort to reduce the occurrence of such types of false positives, proximity sensor 26 may be provided with a pair of conductive planar members that are used in performing electrical proximity sensing. For example, proximity sensor 26 may be provided with a first conductive planar member 114 that is coupled to LED 110 via path 120 and a second conductive planar member 116 that is coupled to photodiode 112 via path 122. Paths 120 and 122 may foe formed from flex cables, wires, indium tin oxide traces or other conductive patterned traces formed on a dielectric substrate, etc.

Appropriate voltages may be applied to members 114 and 116 so that an electric field, may be generated at the surface of cover glass 44 in the vicinity of proximity sensor 26 (see, e.g., electric field lines 140 in FIG. 5). In practice, conductive planar members 114 and 116 serve as opposing ends of a capacitive structure and may collectively be used to provide proximity sensing via capacitive sensing mechanisms. Members 114 and 116 may therefore sometimes be referred to as capacitive electrodes or capacitive structures. For example, any disturbance in the electric field within a predetermined threshold distance Xd from the surface of cover glass 44 may be detected via this capacitive sensing mechanism. Distance Xd may be equal to 5 cm, 1 cm, or other suitable distance (as examples).

The electric field generated using capacitive electrodes 114 and 116 may be sensitive to human body parts (e.g. a user's finger(s), head, etc.) within distance Xd of device 10 but relatively insensitive to smudge. For example, if a user's head 142 is in close enough proximity to sensor 26, a sufficient disturbance in the electric field will be detected using sensor 26 to determine the presence of a user. An accurate determination of a user's proximity to device 10 can be obtained whether or not smudge 130 is present. Electrical proximity sensing such as capacitive-based proximity sensing of this type can therefore be used to prevent false positive readings when smudge is present.

Electrical proximity sensing may also be used to prevent occurrences of false negatives (e.g., situations in which the absorption of light by dark hair makes it erroneously appear as though device 10 is not in the vicinity of the user's head when it is). The electric field lines will be disturbed in the presence of a user, regardless of the user's hair color. As a result, an accurate determination of a user's proximity to device 10 can be obtained using the electrical sensing capabilities of proximity sensor 26 whether or not the user has dark hair. The example of FIG. 5 in which capacitive sensing is used is merely illustrative. If desired, other suitable ways for performing electrical proximity sensing may be used.

Figure 6A:
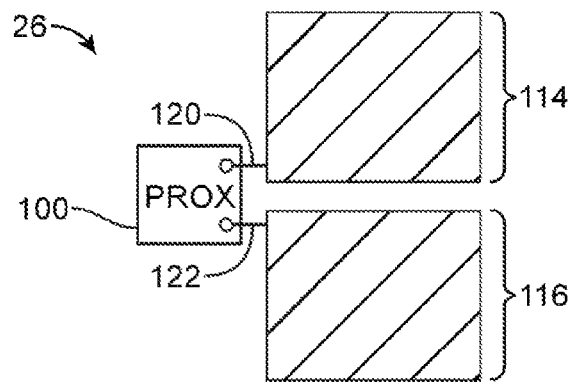
FIGS. 6A, 6B, and 6C are top views of illustrative proximity sensor configurations in accordance with an embodiment of the present invention.

FIG. 6A shows one suitable arrangement of proximity sensor 26 in which electrodes 114 and 116 are rectangular plates. Electrodes 114 and 116 may be coplanar (e.g., formed in the same plane as shown in FIG. 5) or may be vertically offset with respect to each other. Electrodes 114 and 116 may be coupled to emitter 28 and detector 30 in package 100 via paths 120 and 122, respectively. If desired, electrodes 114 and 116 may have circular shapes, triangular shapes, or other polygonal shapes.

Figure 6B:
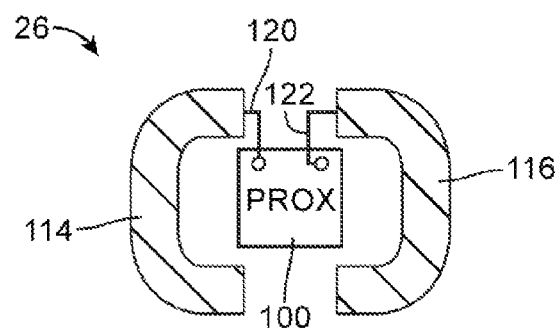

FIG. 6B shows another suitable arrangement of proximity sensor 26 in which electrodes 114 and 116 are U-shaped planar members laterally surrounding sensor package 100 (i.e., a package that includes the emitter and detector pair). As shown in FIG. 6B, first U-shaped conductive planar structure 114 may surround package 100 from, a first side, whereas second U-shaped conductive planar structure 116 may surround package 100 from a second side opposite of the first side. U-shaped electrodes 114 and 116 may be coupled to emitter 28 and detector 30 in package 100 via paths 120 and 122, respectively. If desired, U-shaped electrodes 114 and 116 may have rounded corners and/or sharp corners.

Figure 6C:
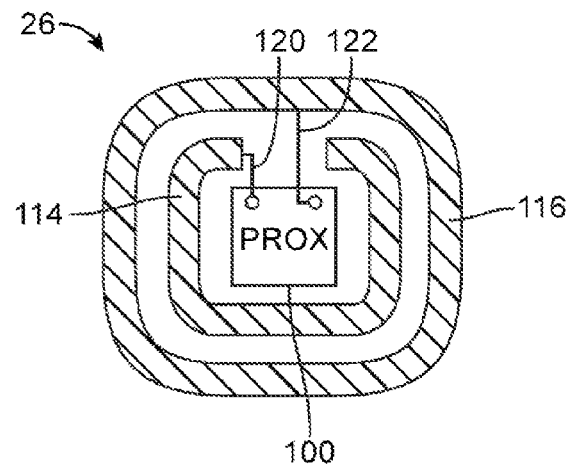

FIG. 6C shows another suitable arrangement of proximity sensor 26 in which electrodes 114 and 116 are ring-shaped planar structures that laterally surround sensor-package 100. As shown in FIG. 6C, first ring-shaped conductive electrode 114 having a first diameter may surround package 100 while second ring-shaped conductive electrode 116 having a second diameter that is greater than the first diameter may completely surround the first ring-shaped electrode 114. Ring-shaped electrodes 114 and 116 may be coupled to emitter 28 and detector 30 in package 100 via paths 120 and 122, respectively. If desired, ring-shaped electrodes 114 and 116 may have rounded corners and/or sharp corners.

Figure 7:
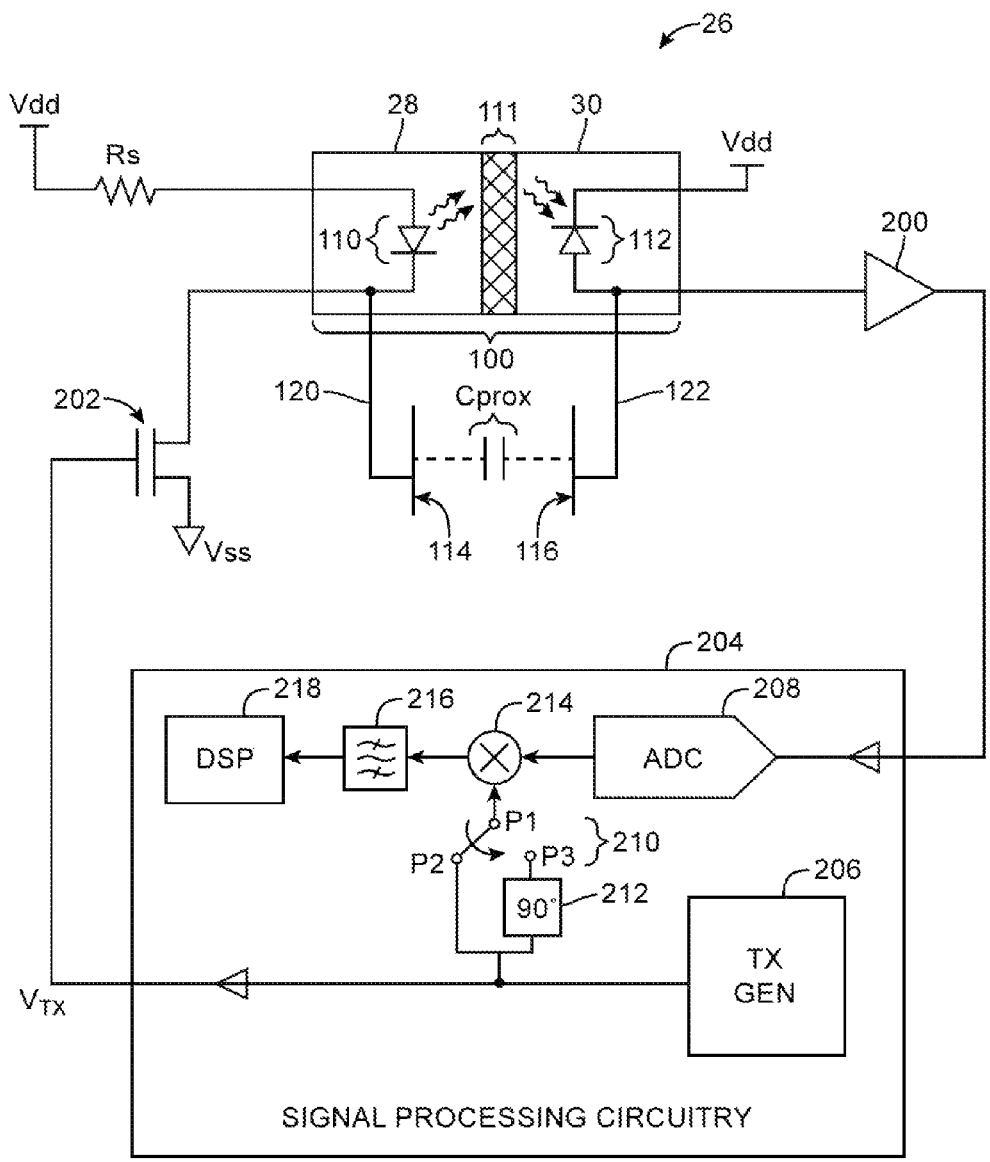
FIG. 7 is a circuit diagram of a proximity sensor and associated signal processing circuitry in accordance with an embodiment of the present invention.

FIG. 7 is a diagram showing one suitable circuit implementation of proximity sensor 26. As shown in FIG. 7, proximity sensor 26 may foe coupled to associated signal processing circuitry 204 that is used for controlling the operation of sensor 26 and that is used for analyzing data gathered using sensor 26. In particular, LED 110 may have a first (p-type) terminal that receives a positive power supply voltage Vdd via source resistor Rs and a second (n-type) terminal that is coupled to ground (e.g., a ground power supply source on which ground power supply Vss is provided) via a transistor such as n-channel transistor 202. Source resistor Rs may be used to limit the amount of current that is being drawn from the positive power supply source. First capacitive electrode 114 may foe coupled to the second terminal of LED 110 via path 120. Photodiode 112 may have a first (n-type) terminal that receives positive power supply voltage Vdd and a second (p-type) terminal that is coupled to second capacitive electrode 116 via path 112.

Light-emitting diode 110 and photosensor 112 may be used primarily for optical proximity sensing, whereas capacitive electrodes 114 and 116 may be used primarily for electrical proximity sensing. During operation of proximity sensor 26, photosensor 112 may receive some amount of reflected infrared light when a user is not in close proximity to device 10. When a user is in close enough proximity to device 10 (e.g., when a user's body part is within 5 cm or less of sensor 26), photosensor 112 may receive an elevated amount of infrared light that is greater than a predetermined light threshold and may produce a corresponding positive optical reading. A positive optical reading can be indicative of a user who is in close proximity to device 10 or the presence or smudge over sensor 26.

An electric field between capacitive electrodes 114 and 116 may produce an effective capacitance Cprox near the surface of cover glass 44. Capacitance Cprox may exhibit a baseline value when a user is not in close proximity to device 10. When an object is brought in the vicinity of device 10, capacitance Cprox may be altered from its baseline value. When a user's body part or other conductive entity is in close enough proximity to sensor 26, Cprox may deviate from the baseline value by an amount that is greater than a predetermined threshold capacitance to produce a corresponding positive electrical reading. A positive electrical reading is indicative of a user who is in close proximity to device 10. Proximity sensors 26 that rely on electrical sensing may produce more accurate results compared to a proximity sensor that only relies on optical sensing since electrical sensing does not depend on the reflectivity of a nearby object and since smudge only minimally affects Cprox (e.g., electrical sensing techniques can be used to prevent false negative readings and false positive readings).

Referring again to FIG. 7, signal processing circuitry 204 may have an input and an output. The second terminal of photodiode 112 may be coupled, to the input of circuitry 204 via an operational amplifier circuit 200. Operational amplifier circuit 200 may be used to amplify signals that have been detected by photodiode 112. Amplifier 200 may sometimes be considered to be part of circuitry 204. Transistor 202 may have a gate that is coupled to the output, of circuitry 204. Sensor data may be provided from proximity sensor 26 to the input of circuitry 204 via amplifier 200, whereas a control signal may be provided from the output of circuitry 204 to sensor 26 to control the operation of sensor 26.

Signal processing circuitry 204 may include a transmit (TX) signal generator 206, a data converting circuit such as analog-to-digital converter (ADC) 208, a mixer circuit 214, a phase shift circuit 212 (e.g., a 90° phase shift circuit), a filter circuit 216, and a digital signal processor (DSP) 218. Signal generator 206 may be configured to output a periodic transmit signal $V_{TX}$ to the gate of transistor 202. Signal $V_{TX}$ may, for example, be a square-wave clock signal, a sine-wave control signal, a cosine-wave control signal, or other types of periodic control signal. Control signal $V_{TX}$ may be used to activate and deactivate transistor 202 in an alternating fashion. When transistor is turned on (e.g., during a positive/high clock phase of $V_{TX}$), the second terminal of LED 110 may be pulled to ground to trigger infrared light emission using LED 110. When transistor 202 is turned off (e.g., a negative/low clock phase of $V_{TX}$), the second terminal of LED 110 may be disconnected from a direct-current power supply source to disable LED 110.

Figure 8:
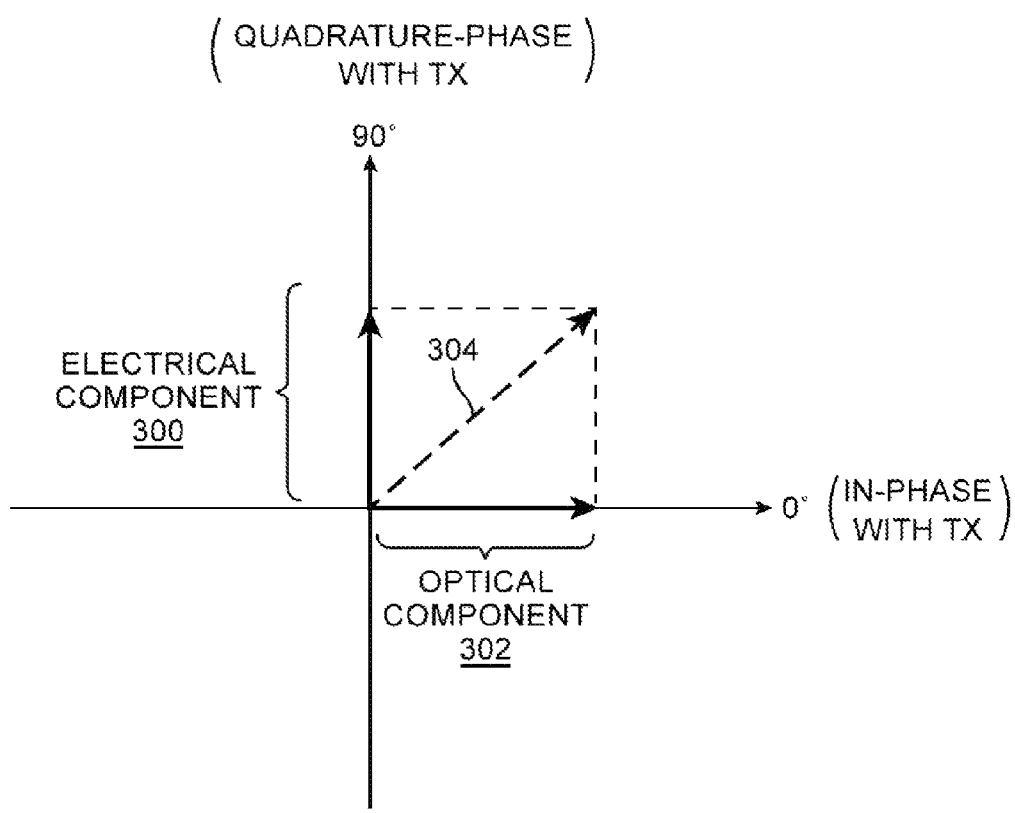
FIG. 8 is a diagram showing how an integrated proximity sensor signal may include an optical signal component and an electrical signal component in accordance with an embodiment of the present invention.

Proximity sensor 26 may produce an integrated sensor output signal that includes both optical proximity sensor data content and electrical proximity sensor data content. FIG. 8 is a diagram showing an integrated sensor output signal 304 having an optical signal component 302 and an electrical signal component 300. As shown in FIG. 8, optical signal component 302 may foe in-phase with the transmit signal (e.g., the optical signal component may have a 0° phase offset with respect, to $V_{TX}$) while electrical signal component 300 may have a quadrature phase relationship with the transmit signal (e.g., the electrical signal component may have a 90° phase offset with respect to $V_{TX}$). The electrical signal is in quadrature phase with respect, to the optical signal (which is in phase with voltage $V_{TX}$) since the electrical signal relies on capacitive sensing (e.g., current charging a capacitance is proportional to the first derivative of voltage).

The magnitude of optical component 302 may vary depending on the amount, of light that is detected using photo-diode 112 (e.g., higher levels of reflected infrared light will result in larger magnitudes for vector 302), whereas the magnitude of electrical component 300 may vary depending on the amount of electric field disturbance experienced by capacitive electrodes 114 and 116 (e.g., higher levels of disturbance in the electric field will result in larger magnitudes for vector 300). The integrated sensor output signal 304 may be the vector sum of optical signal component 302 and electrical signal component 300.

The integrated sensor output signal generated by proximity sensor 26 may be amplified using circuit 200 and fed to analog-to-digital converter 208. Converter 208 may be used to convert the integrated sensor output, signal to its digital equivalence (e.g., converter 208 may foe used to generate a digitized version of the amplified analog integrated sensor output, signal). Mixer 214 may have a first, input that receives the digital version of the integrated sensor output signal from ADC 208, a second input that receives either signal $V_{TX}$ or a phase-shifted version of signal $V_{TX}$ from TX generator 206, and an output.

In the example of FIG. 7, a switching circuit such as a single-pole double-throw switch 210 may be coupled between the second input of mixer 214 and generator 206. In particular, switch 210 may have a first switch port P1 that is coupled to the second input of mixer 214, a second switch port P2 that directly receives signal $V_{TX}$ from, generator 206, and a third switch port P3 that receives the phase-shifted version of signal $V_{TX}$ via phase shifter 212. Phase shifter 212 may serve to shift $V_{TX}$ by 90° (i.e., by a quarter clock cycle).

During a first detection mode (e.g., a first analysis mode during which the optical signal component is being extracted from the integrated sensor output signal), switch 210 may be placed in a first state such that port P1 is coupled to port P2 to allow the integrated signal to be multiplied directly with signal $V_{TX}$. Multiplying (or "mixing") the integrated sensor output signal with a periodic signal in this way may provide a corresponding demodulated signal at the output of mixer 214, where the demodulated, signal has an average value that is only proportional to the magnitude of optical component 302 (FIG. 8). Demodulated signals generated in this way may be filtered using circuit 216 to remove undesired noise/interference signals at unrelated frequencies. The filtered signals may then be received by digital signal processor 218 for further processing.

During a second detection mode (e.g., a second analysis mode during which the optical signal component is being extracted from the integrated sensor output signal), switch 210 may be placed in a second state such that port P1 is coupled to port P3 to allow the integrated signal to be multiplied with the phase-shifted $V_{TX}$. Mixing the integrated sensor output signal with a 90° phase-shifted version of $V_{TX}$ in this way may provide a corresponding demodulated signal having an average value that is only proportional to the magnitude of electrical component 300 (FIG. 8). Demodulated signals generated in this way may be filtered using circuit 216 to remove undesired noise/interference signals at unrelated frequencies. The filtered signals may then be received by digital signal processor 218 for further processing.

The filtered signals received by signal processor 218 during the first and second detection modes may be used in determining whether a conductive object such as a user's body part is in close proximity with sensor 26, FIG. 9 is a table of different scenarios that can be identified using proximity sensor 26 of the type described in connection with FIG. 7. Filtered signals received during the first detection mode may be compared to a predetermined, light threshold value to determine whether an external object is in close proximity to device 10 based on optical sensing techniques described herein (e.g., using emitter 28 and detector 30. If the signals are less than the predetermined light threshold, a corresponding low or "0" optical sensor reading may be output. If the signals are greater than the predetermined light threshold, a corresponding high or "1" optical sensor reading may be output.

Filtered signals received during the second detection mode may be compared to a predetermined capacitance baseline value to determine whether an external object is in close proximity to device 10 based on electrical sensing techniques described herein (e.g., using capacitive structures 114 and 116). If the signals are reflective of a capacitance value that deviates from the predetermined capacitance by more than a given threshold, a corresponding high or "1" electrical sensor reading may be output. If the signals are indicative of a capacitance value that deviates from the predetermined capacitance by less than the given threshold, a corresponding low or "0" electrical sensor reading may be output.

As shown in the table of FIG. 9, there may be at least four different possible scenarios. In a first scenario (A) in which no external object is in the vicinity of device 10 and in which no smudge is present on the display cover glass, optical sensor reading and electrical sensor reading are both low, and signal processor 218 may correctly determine that no user is nearby.

In a second scenario (B) in which a user with dark hair is present (as an example), the optical sensor reading may be low, whereas the electrical sensor reading may be high. In this scenario, signal processor 218 may accurately determine that an object is nearby since the electrical sensor reading is high (e.g., the electrical sensor reading corrected a false negative, as indicated by arrow 350).

In a third scenario (C) in which a user is not present but smudge is deposited on the surface of cover glass 44 above proximity sensor 26 (see, e.g., FIG. 5), the optical sensor reading may be high (due to deflection from the smudge), whereas the electrical sensor reading may be low. In this scenario, signal processor 218 may accurately determine that no user is nearby since the electrical sensor reading is low (e.g., the electrical sensor reading corrected a false positive, as indicated by arrow 352).

In a fourth exemplary scenario (D) in which a user with lighter hair is in close proximity to device 10 (smudge may or may not be present), the optical sensor reading and electrical sensor reading are both high, and signal processor 218 may correctly determine that a user is nearby. According to the truth table of FIG. 9, a simple logic AND gate may be implemented in digital signal processor 218 to combine the optical and electrical sensor readings. A combined output having a logic "0" value is indicative of the absence of a nearby user, whereas a combined output having a logic "1" value is indicative of the presence of a user in close proximity to device 10.

In another suitable arrangement, signal processing circuit 218 may be configured to compute a proximity sensor score value as follows:

$$\text{score} = w1 * |S_{OPT} - S_{THRES}| + w2 * |S_{ELEC} - S_{BASE}| \quad (1)$$

where w1 and w2 represent different weighting factors for optical sensor data and electrical sensor data, respectively, where $S_{OPT}$ represents the filtered optical signal magnitude received during the first detection mode, where $S_{THRES}$ represents a predetermined light threshold value to which $S_{OPT}$ can be compared, where $S_{ELEC}$ represents the filtered electrical signal magnitude received during the second detection mode, and where $S_{BASE}$ represents a baseline capacitive value to which $S_{ELEC}$ can be compared.

If desired, electrical detection may be given more weight when calculating the sensor score (e.g., w1 may be greater than w2). If desired, optical detection may be given more weight when calculating the sensor score (e.g., w2 may be greater than w1). Processor 218 may compare the sensor score computed as shown in expression 1 to a predetermined threshold score. A computed proximity sensor score that is less than the predetermined threshold score may be indicative of the absence of a nearby user, whereas a computed proximity sensor score that is greater than the predetermined threshold score may be indicative of the presence of a user in close proximity to device 10.

The techniques as described herein that take into account both optical sensor readings and electrical sensor readings when making a user proximity determination is merely illustrative and do not serve to limit the scope of the present invention. If desired, other ways of determining whether a user is present based on the optical and electrical sensor readings may be used. In other embodiments, proximity sensor 26 may include only electrical proximity sensing circuitry (without any optical sensing circuitry).

Figure 10:
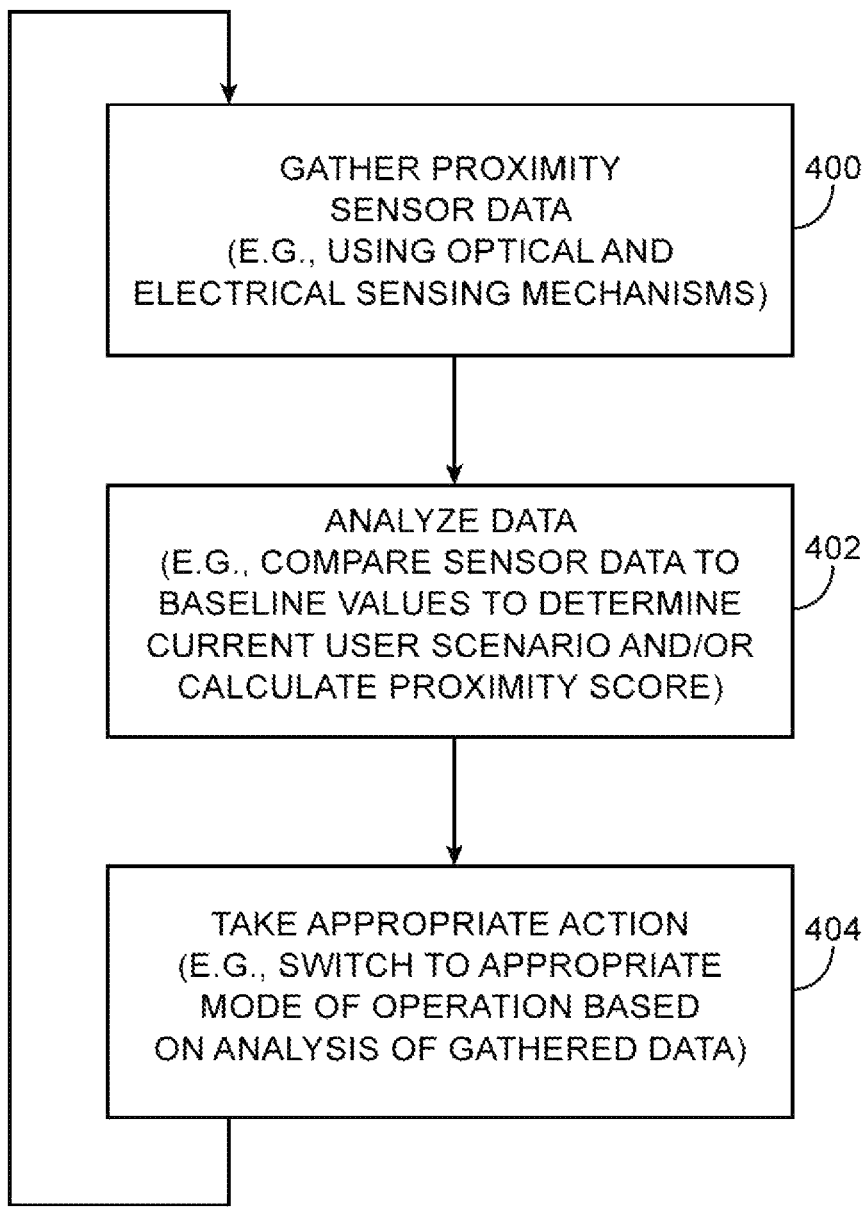
FIG. 10 is a flow chart of illustrative steps involved in operating a proximity sensor having optical and electrical sensing capabilities in accordance with an embodiment of the present invention.

FIG. 10 is a flow chart of illustrative steps involved in gathering and using proximity sensor data in the operation of device 10. As shown in FIG. 10, electronic device 10 may gather proximity sensor data during the operations of step 400. During step 400, storage and processing circuitry 40 may, for example, use proximity sensor 26 of the type described in connection with FIG. 5 to make optical proximity sensing measurements using infrared light emitter and detector circuitry and electrical proximity sensing measurements using capacitive sensing circuitry. Measurement data may be stored in storage in circuitry 40 (e.g., in a buffer having storage bins).

At step 402, gathered proximity sensor data may be analyzed by device 10. Storage and processing circuitry 40 may compare proximity sensor data that has been gathered to one or more threshold values. For example, the optical sensor measurements may be compared to a predetermined light threshold level, whereas the electrical sensor measurements may be compared to a baseline capacitance level. These comparisons may be used to determine a current user scenario (e.g., using an algorithm as described in connection with FIG. 9 or by computing a proximity score using equation 1).

At step 404, device 10 may take suitable action based on the results of the analysis operations of step 402. For example, device 10 may activate or inactivate a voice recognition feature in device 10 or other device functionality. As another example, device 10 may use storage and processing circuitry 40 (sometimes referred to as control circuitry) to control input-output circuitry 32 such as touch sensor and/or display components based on information on whether proximity sensor readings exceeded or did not exceed proximity sensor thresholds. Time constraints (e.g., information on the time period, over which threshold values were exceeded or not exceeded), time-based filtering, and other signal processing techniques may be used in analyzing proximity sensor data during the operations of step 402.

Actions that may be taken at step 404 in response to the data analysis operations of step 402 may include enabling components, disabling components, adjusting the power supplied to components, or otherwise adjusting the operating parameters of input-output circuitry 32 of device 10. With one illustrative arrangement, which is sometimes described herein as an example, touch screen functionality and display output functionality may be selectively enabled and disabled based on proximity sensor information from sensor 26.

The foregoing is merely illustrative of the principles of this invention and various modifications can be made by those skilled in the art without departing from the scope and spirit of the invention. The foregoing embodiments may be implemented individually or in any combination.

What is claimed is:

1. A method of operating an electronic device having a proximity sensor that includes optical proximity sensor circuitry and electrical proximity sensor circuitry, the method comprising:
   with the optical proximity sensor circuitry, gathering optical proximity sensor data by emitting light and detecting corresponding reflected light;
   with the electrical proximity sensor circuitry, gathering capacitive proximity sensor data by detecting a change in capacitance;
   with the proximity sensor, generating an integrated sensor output signal that includes the optical proximity sensor data and the capacitive proximity sensor data; and
   with signal processing circuitry, extracting only the optical proximity sensor data from the integrated sensor output signal by demodulating the integrated sensor output signal using a first control signal.

2. The method defined in claim 1, wherein the electronic device further includes a touch screen display and control circuitry, the method further comprising:
   with the control circuitry, controlling the touch screen display based on the optical proximity sensor data and the capacitive proximity sensor data.

3. The method defined in claim 1, wherein the optical proximity sensor circuitry includes a light emitter and a light detector, and wherein gathering the optical proximity sensor data comprises emitting infrared light with the light emitter and detecting corresponding reflected infrared light with the light detector.

4. The method defined in claim 1, wherein the electrical proximity sensor circuitry includes capacitive electrodes, and wherein gathering the capacitive proximity sensor data comprises monitoring the capacitance with the capacitive electrodes.

5. The method defined in claim 1,
   with the signal processing circuitry, extracting the capacitive proximity sensor data from the integrated sensor output signal by demodulating the integrated sensor output signal using a second control signal that is different than the first control signal, wherein the first and second control signals are periodic control signals.

6. The method defined in claim 5, further comprising:
   with the signal processing circuitry, comparing the optical proximity sensor data and the capacitive proximity sensor data to predetermined values to determine whether an external object is in the vicinity of the electronic device.

7. The method defined in claim 5, further comprising:
   with the signal processing circuitry, computing a proximity sensor score by weighting the optical proximity sensor data and the capacitive proximity sensor data with different respective weighting factors; and
   comparing the computed proximity sensor score to a predetermined threshold score to determine whether an external object is in the vicinity of the electronic device.

8. A method of operating an electronic device having a proximity sensor and associated signal processing circuitry, comprising:
   generating a sensor output signal with the proximity sensor, wherein the sensor output signal comprises a first signal component corresponding to a first component in the proximity sensor that is integrated with a second signal component corresponding to a second component in the proximity sensor;
   with the signal processing circuitry, analyzing the sensor output signal to extract the first signal component from the sensor output signal during a first detection mode;
   with the signal processing circuitry, analyzing the sensor output signal to extract the second signal component from the sensor output signal during a second detection mode that is different than the first detection mode; and
   after analyzing the sensor output signal to extract the first signal component from the sensor output signal during the first detection mode and before analyzing the sensor output signal to extract the second signal component from the sensor output signal during the second detection mode, switching from the first detection mode to the second detection mode using switching circuitry.

9. The method defined in claim 8, wherein the electronic device further includes a touch screen display, the method further comprising:
   controlling the touch screen display based on the first and second extracted signal components.

10. The method defined in claim 8, wherein the signal processing circuitry further comprises an amplifying circuit, a data converting circuit, and a filter circuit, and wherein analyzing the sensor output signal further comprises:
    amplifying the sensor output signal with the amplifying circuit;
    performing data conversion operations on the amplified sensor output signals with the data converting circuit; and
    performing filtering operations on the converted sensor output signals with the filter circuit.

11. The method defined in claim 8, wherein analyzing the sensor output signal to extract the first signal component from the sensor output signal during the first detection mode comprises analyzing the sensor output signal to extract only the first signal component from the sensor output signal during the first detection mode, and wherein analyzing the sensor output signal to extract the second signal component from the sensor output signal during the second detection mode comprises analyzing the sensor output signal to extract only the second signal component from the sensor output signal during the second detection mode.

12. A method of operating an electronic device having a proximity sensor and associated signal processing circuitry, comprising:
    generating a sensor output signal with the proximity sensor, wherein the sensor output signal comprises a first signal component corresponding to a first component in the proximity sensor that is integrated with a second signal component corresponding to a second component in the proximity sensor;
    with the signal processing circuitry, analyzing the sensor output signal to extract the first signal component from the sensor output signal during a first detection mode; and
    with the signal processing circuitry, analyzing the sensor output signal to extract the second signal component from the sensor output signal during a second detection mode that is different than the first detection mode, wherein the first component comprises optical proximity sensor structures, wherein the second component comprises capacitive proximity sensor structures, wherein the first signal component comprises optical proximity sensor data gathered using the optical proximity sensor structures, wherein the second signal component comprises capacitive proximity sensor data gathered using the capacitive proximity sensor structures, wherein extracting the first signal component comprises extracting the optical proximity sensor data from the sensor output signal, and wherein extracting the second signal component comprises extracting the capacitive proximity sensor data from the sensor output signal.

13. The method defined in claim 12, further comprising:
comparing the extracted optical proximity sensor data to a predetermined light threshold; and
comparing the extracted capacitive proximity sensor data to a predetermined baseline capacitance.

14. The method defined in claim 12, further comprising:
computing a proximity sensor score by weighting the optical proximity sensor data and the capacitive proximity sensor data with different respective weighting factors; and
comparing the computed proximity sensor score to a predetermined threshold score to determine whether an external object is in the vicinity of the electronic device.

15. A method of operating an electronic device having a proximity sensor and associated signal processing circuitry, comprising:
generating a sensor output signal with the proximity sensor;
with the signal processing circuitry, analyzing the sensor output signal to extract a first signal component from the sensor output signal during a first detection mode; and
with the signal processing circuitry, analyzing the sensor output signal to extract a second signal component from the sensor output signal during a second detection mode that is different than the first detection mode, wherein the signal processing circuitry further comprises a signal generator and a mixer, and wherein analyzing the sensor output signal to extract the first signal component comprises:
with the signal generator, generating a control signal; and
with the mixer, receiving the control signal and the sensor output signal and producing a corresponding demodulated signal during the first detection mode.

16. The method defined in claim 15, wherein the signal processing circuitry further comprises a phase shift circuit, and wherein analyzing the sensor output signal to extract the second signal component comprises:
with the phase shift circuit, providing a phase-shifted version of the control signal; and
with the mixer, receiving the phase-shifted version of the control signal and the sensor output signal and producing a corresponding demodulated signal during the second detection mode.

* * * * *